(12) United States Patent  (10) Patent No.: US 9,319,030 B2
Gentner et al.  (45) Date of Patent: Apr. 19, 2016

(54) INTEGRATED CIRCUIT FAILURE PREDICTION USING CLOCK DUTY CYCLE RECORDING AND ANALYSIS

(71) Applicant: International Business Machines Corporation, Armonk, NY (US)

(72) Inventors: Thomas Gentner, Boeblingen (DE); Klaus P. Gungl, Sindelfingen (DE); Guenther Hutzl, Sindelfingen (DE)

(73) Assignee: International Business Machines Corporation, Armonk, NY (US)

( * ) Notice: Subject to any disclaimer, the term of this patent is extended or adjusted under 35 U.S.C. 154(b) by 197 days.

(21) Appl. No.: 14/103,958

(22) Filed: Dec. 12, 2013

(65) Prior Publication Data

US 2015/0171835 A1  Jun. 18, 2015

(51) Int. Cl.
*H03K 3/017* (2006.01)
*H03K 5/156* (2006.01)

(52) U.S. Cl.
CPC .............. *H03K 3/017* (2013.01); *H03K 5/1565* (2013.01)

(58) Field of Classification Search
CPC ....... H03K 5/1565; H03K 3/017; H03K 7/08; H03K 5/15; H03L 7/0812
USPC .................................................. 327/172–175
See application file for complete search history.

(56) References Cited

U.S. PATENT DOCUMENTS

| 7,015,739 | B2 | 3/2006 | Lee et al. |
| 7,308,632 | B1 | 12/2007 | Verma et al. |
| 7,360,135 | B2 | 4/2008 | Boerstler et al. |
| 7,612,620 | B2 | 11/2009 | Rausch et al. |
| 7,612,622 | B2 | 11/2009 | Margittai |
| 7,617,509 | B1 | 11/2009 | Brunheroto et al. |
| 7,642,863 | B2 | 1/2010 | Kaneko et al. |
| 7,646,177 | B2 | 1/2010 | Boerstler et al. |
| 7,839,195 | B1 | 11/2010 | Feng et al. |
| 7,917,795 | B2 | 3/2011 | Boerstler et al. |
| 8,228,105 | B2 | 7/2012 | McLeod et al. |
| 2007/0159224 | A1 | 7/2007 | Dwarka et al. |
| 2008/0272814 | A1 | 11/2008 | Chiang et al. |
| 2009/0128133 | A1 | 5/2009 | Boerstler et al. |

(Continued)

OTHER PUBLICATIONS

Bhatti et al., "Duty Cycle Measurement and Correction Using a Random Sampling Technique", 48th Midwest Symposium on Circuits and Systems, 2005. http://www.isi.edu/~draper/papers/mwscas05_bhatti.pdf.

(Continued)

*Primary Examiner* — Diana J Cheng
(74) *Attorney, Agent, or Firm* — Scully, Scott, Murphy & Presser, P.C.

(57) ABSTRACT

A system is disclosed, which may include a clock distribution circuit. The clock distribution circuit may include a duty cycle controller to distribute a clock output signal to a plurality of remote locations on a clock grid. The duty cycle controller may adjust, in response to a duty cycle control signal, a duty cycle of the clock output signal. The clock distribution circuit may also include a duty cycle measurement unit, to measure the duty cycle of the clock output signal at one of the remote locations, generate the duty cycle control signal, and generate and write duty cycle data values to a memory unit. The system may also include control logic to calculate and transmit a clock distribution circuit end-of-life date, by applying a model to stored duty cycle data values and to a duty cycle controller adjustment state.

19 Claims, 6 Drawing Sheets

(56) References Cited

U.S. PATENT DOCUMENTS

2012/0280732 A1 11/2012 Roytman et al.
2012/0280733 A1 11/2012 Zhu

OTHER PUBLICATIONS

Chow, H., "Duty Cycle Adjusting Circuit for Clock Signals," Proceedings of the 6th WSEAS ICAI'05/MCBC'05/AMTA'05/MCBE'05. Steven's Point, Wisconsin, 2005.
Arp, A., et al., "Duty Cycle Adjustment with Error Resiliency," U.S. Appl. No. 14/103,940, filed Dec. 12, 2013.

400
Minimum / Maximum
Value Table

T = 1

|     | COL 1 MIN | COL 2 MAX |
| --- | --- | --- |
| ROW 1 | 50 | 50 |
| ROW 2 |  |  |
| ROW 3 |  |  |
| ROW 4 |  |  |

T = 2

|     | COL 1 MIN | COL 2 MAX |
| --- | --- | --- |
| ROW 1 | 50 | 60 |
| ROW 2 |  |  |
| ROW 3 |  |  |
| ROW 4 |  |  |

T = 3

|     | COL 1 MIN | COL 2 MAX |
| --- | --- | --- |
| ROW 1 | 54 | 60 |
| ROW 2 | 50 | 60 |
| ROW 3 |  |  |
| ROW 4 |  |  |

T = 4

|     | COL 1 MIN | COL 2 MAX |
| --- | --- | --- |
| ROW 1 | 52 | 54 |
| ROW 2 | 52 | 60 |
| ROW 3 |  |  |
| ROW 4 |  |  |

T = 5

|     | COL 1 MIN | COL 2 MAX |
| --- | --- | --- |
| ROW 1 | 52 | 56 |
| ROW 2 | 52 | 56 |
| ROW 3 |  |  |
| ROW 4 |  |  |

FIG. 4

500
Accumulated Average
Value Table

T = 1

|     | COL 1 | COL 2 |
| --- | --- | --- |
| ROW 1 | 50 |  |
| ROW 2 |  |  |
| ROW 3 |  |  |
| ROW 4 |  |  |

T = 2

|     | COL 1 | COL 2 |
| --- | --- | --- |
| ROW 1 | 60 | 50 |
| ROW 2 | 55 |  |
| ROW 3 |  |  |
| ROW 4 |  |  |

T = 3

|     | COL 1 | COL 2 |
| --- | --- | --- |
| ROW 1 | 54 | 60 |
| ROW 2 | 55 |  |
| ROW 3 |  |  |
| ROW 4 |  |  |

T = 4

|     | COL 1 | COL 2 |
| --- | --- | --- |
| ROW 1 | 52 | 54 |
| ROW 2 | 53 | 55 |
| ROW 3 |  |  |
| ROW 4 |  |  |

T = 5

|     | COL 1 | COL 2 |
| --- | --- | --- |
| ROW 1 | 56 | 52 |
| ROW 2 | 53 | 55 |
| ROW 3 |  |  |
| ROW 4 |  |  |

INTEGRATED CIRCUIT FAILURE PREDICTION USING CLOCK DUTY CYCLE RECORDING AND ANALYSIS

TECHNICAL FIELD

The present disclosure relates to the duty cycle of clock distribution circuits. In particular, this disclosure relates to sampling and recording duty cycle measurements for use in predicting hardware failure due to drift in hardware characteristics.

BACKGROUND

A clock signal is a type of signal that may regularly oscillate between a logical high state and a logical low state. A clock signal, particularly the transitions between high and low states, may be used in synchronous digital circuits, such as an integrated circuit (IC), to coordinate the movement of data between synchronous data storage elements.

An IC clock may be generated on the IC, or may be generated by an external clock generator connected to the IC. A clock signal may have a specified, fixed frequency, and the timing of logic circuits may be designed to operate in accordance with this fixed frequency. A clock signal may be coupled to a number of synchronous storage elements through a clock distribution network that may include a clock distribution structure such as a clock grid, or clock tree. The distribution network may also include active circuits, such as buffers, to provide appropriate drive levels for a particular distribution structure.

SUMMARY

Various aspects of the present disclosure may be useful for predicting an end-of-life (EOL) date for an integrated circuit (IC) due to uncorrectable drift in its clock duty cycle. A system (including an IC) configured according to embodiments of the present disclosure may transmit a warning message with a predicted EOL date, while experiencing little (or no) loss of normal operating performance, resulting from the use of a clock distribution circuit.

Embodiments may be directed towards a system. The system may include a clock distribution circuit having a duty cycle controller, designed to receive a reference clock input, and output, in response to the reference clock input, a clock output signal on a clock output. The duty cycle controller may also adjust, in response to a duty cycle control signal, a duty cycle of the clock output signal. The clock distribution circuit may also include a clock grid, coupled to the clock output and designed to distribute the clock output signal to a plurality of remote locations, and a duty cycle measurement unit. The duty cycle measurement unit may be designed to measure the duty cycle of the clock output signal at one of the remote locations and at a plurality of time intervals, and generate duty cycle data values for the clock output signal at the plurality of time intervals. The duty cycle measurement unit may also be designed to generate the duty cycle control signal based on at least one of the duty cycle data values, and write the duty cycle data values to a memory unit designed to store a plurality of duty cycle data values. The clock distribution circuit may also include a control logic designed to calculate a predicted EOL date for the clock distribution circuit by applying a model to duty cycle data values from the memory unit, and an adjustment state of the duty cycle controller. The control logic may also be designed to transmit the predicted EOL date, in response to a failure prediction request.

Embodiments may also be directed towards a method for monitoring and recording duty cycle data of an IC. The method may include generating, in response to a reference clock, a clock output signal having a duty cycle, and transmitting the clock output signal to a clock grid configured to distribute the clock output signal to a plurality of remote locations. The method may also include measuring the duty cycle of the clock output signal at a one of the remote locations and at a plurality of time intervals, and generating duty cycle data values for the clock output signal at the plurality of time intervals. The method may also include modifying, based on at least one duty cycle data value, the duty cycle of the clock output signal, and writing the duty cycle data values to a memory unit.

Embodiments may also be directed towards a method for monitoring and recording duty cycle data of an IC. The method may include measuring, at a predetermined interval, and with a duty cycle measurement unit, a duration of a clock output signal at a first level and a duration of the clock output signal at a second level. The method may also include calculating, from the duration of the clock output signal at the first and at the second level of the clock output signal, duty cycle data values, over a time period, and storing the duty cycle data values in a storage location in a memory unit. The method may also include receiving an EOL date request from a requesting client, and applying a model to at least one of the stored duty cycle data values and to an adjustment state of the duty cycle controller, to generate an output. The method may also include comparing the output of the model to at least one predetermined duty cycle failure value, calculating, based on the output of the model, a predicted EOL date, and transmitting the predicted EOL date to the requesting client.

Aspects of the various embodiments may be used to enhance system reliability by predicting a failure of an IC within the system. Aspects of the various embodiments may also be useful for providing cost-effective monitoring of an IC's clock duty cycle, by using existing and proven IC, data storage and messaging technologies.

BRIEF DESCRIPTION OF THE DRAWINGS

The drawings included in the present application are incorporated into, and form part of, the specification. They illustrate embodiments of the present disclosure and, along with the description, serve to explain the principles of the disclosure. The drawings are only illustrative of embodiments of the disclosure and are not limiting.

In the drawings and the Detailed Description, like numbers generally refer to like components, parts, steps, and processes

DETAILED DESCRIPTION

Certain embodiments of the present disclosure can be appreciated in the context of a clock distribution circuit that may be used for measuring and recording clock duty cycle data of a processor integrated circuit (IC). Duty cycle data measured and recorded by the clock distribution circuit may be applied to a model, which may generate an estimated end-of-life (EOL) date for the IC. While not necessarily limited thereto, embodiments discussed in this context can facilitate an understanding of various aspects of the disclosure. Certain embodiments may also be directed towards other equipment and associated applications, such as a clock distribution circuit for use with, or inclusion within, application-specific integrated circuits (ASICs). Such ASICs may include, but are not limited to, digital logic circuits fabricated in various semiconductor technologies. Embodiments may also be directed towards clock distribution circuits for mixed-signal ICs that may include both analog and digital circuitry.

Various embodiments of the present disclosure relate to clock distribution circuits configured to generate predicted EOL dates of an IC, resulting from drift in the duty cycle of its clock signal, by measuring, monitoring and analyzing the duty cycle, which can be useful for enhancing the reliability of a system using the IC. The clock distribution circuit may monitor both increases and decreases in an IC's clock duty cycle, and may be configured to be compatible with a variety of IC types and technologies, to provide robust, precise failure prediction based on empirical/historical IC failure data.

A clock distribution circuit designed according to certain embodiments may be compatible with existing and proven IC, data storage, electronic system, and messaging technologies and, and may be a useful and cost-effective way to predict and prevent failure of a system that includes the IC. A clock distribution circuit constructed according to embodiments of the present disclosure may preemptively warn of an upcoming system failure, which may originate from the duty cycle of an IC clock drifting and causing an IC functional failure.

Figure 1:
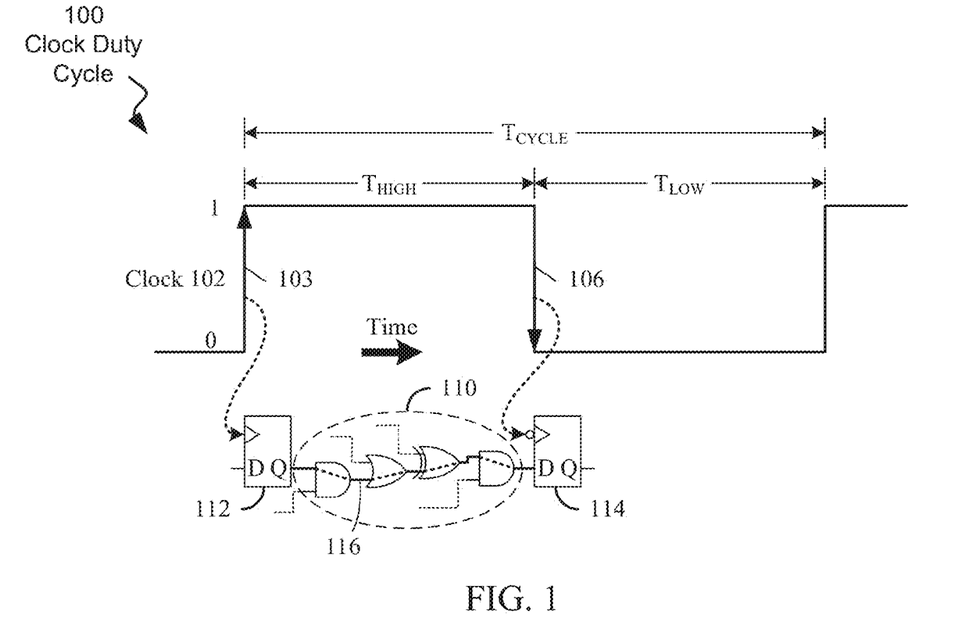
FIG. 1 includes a waveform drawing and a schematic illustrating a clock duty cycle, according to embodiments of the present disclosure.

FIG. 1 is an illustration of a duty cycle of an integrated circuit (IC) clock 102 that includes a clock waveform drawing and a logic schematic, according to embodiments of the present disclosure. The clock signal 102 may be used in synchronizing data flow between clocked elements of the IC.

The duty cycle of a digital clock signal 102 may be the ratio of the time, $T_{HIGH}$, that the clock signal 102 is at a logical high state, to the duration of a clock period, $T_{CYCLE}$, and may generally be described by the following equation:

$$\text{Duty cycle} = T_{HIGH}/T_{CYCLE}$$

Where:
$T_{HIGH}$=duration of the clock 102 in a high logic state
$T_{CYCLE}$=duration of the clock 102 period The duty cycle of clock signal 102 may be expressed as a percentage (e.g., 50%) of a clock signal period $T_{CYCLE}$. The propagation delay of signals passing through logic stages connected between clocked storage elements, on an IC, may be designed to be less than the duration of a particular clock at a certain logic state. For example, the maximum propagation delay of path 116, within combinational logic 110, between clock storage elements 112 and 114, may be designed to be less than $T_{HIGH}$.

Path 116 propagation delay calculations may include timing margins corresponding to propagation delay variations over a range of conditions, i.e., variations in the IC manufacturing process, IC operating voltage and temperature, electrical interference from adjacent signals, and clocked element setup and hold times. The propagation delay of path 116 may be designed to remain less than $T_{HIGH}$ for a specified range of manufacturing variations and operating conditions, which may include $T_{HIGH}$ remaining within a specified operating range.

Maintaining a propagation delay of path 116 (including timing margins) that is less than $T_{HIGH}$ may allow logic values to propagate from the Q output of clocked element 112 to the D input of clocked element 114, before the arrival of the clock 102 (active) falling edge 106, which may ensure the latching of correct and stable values into clocked element 114. If the duty cycle and $T_{HIGH}$ of clock 102 varies (e.g., decreases) outside of a specified range, then the logic value at the D input of 114 may not be correct or stable during falling edge 106, and clocked element 114 may latch an incorrect logic value. Latching an incorrect logic value may result in an IC failure. FIG. 1 illustrates timing related to one logical (high) state of a clock signal. In certain embodiments, the duration of a low logical state of a clock signal may also be related to the timing of logic paths.

The duty cycle of the IC clock signal 102 may change (drift), in response to physical and electrical changes to the IC over time. Physical and electrical changes to an IC may include the effects of electromigration and of negative-bias temperature instability (NBTI). Electromigration (the movement of conductive ions within an electrical conductor, such as a wire in an IC) may cause a thinning of the wire's cross-section and a resulting increase in its resistance. NBTI effects may include an increase in threshold voltage ($V_T$) for P-channel field-effect (PFET) devices, and a resulting decrease in transconductance, and the amount of current they may source. An increase in conductor resistance (from electromigration), and a decrease in current sourced by PFET devices (from NBTI) may both contribute to a shift of a IC clock duty cycle (and/or $T_{HIGH}$) away from a specified or initial value. If an IC clocks duty cycle drifts out of a specified operating range, IC failure may result. Effects from electromigration and NBTI may cause a gradual shift in the duty cycle of an IC's clock signal over an extended period of time, such as months or years, depending on IC characteristics and operating conditions.

A duty cycle controller may be implemented in conjunction with a duty cycle measurement unit, on an IC, in a closed feedback loop configuration, to monitor and maintain the IC's clock duty cycle within a specified operating range. The duty cycle measurement unit may periodically measure the IC's clock duty cycle, compare it to a specified reference value, and provide a signal to the duty cycle controller, which may respond by adjusting the duty cycle.

A duty cycle controller may have a finite number of adjustments steps that may be used to adjust the ICs clock duty cycle, by increasing or decreasing the duration of the clock signal at a particular logic (e.g., high) state, while maintaining the cycle time (e.g., $T_{CYCLE}$, FIG. 1) at a relatively constant duration.

If a duty cycle controller reaches the end of its (finite) duty cycle adjustment range, either by increasing or decreasing the duty cycle using all available adjustments steps, a condition may exist were no further adjustments may be made to the duty cycle. Under this condition, the duty cycle of the IC may subsequently be allowed to drift out of a specified operating range, which may cause the IC to fail.

Monitoring an IC's clock duty cycle drift, number of applied adjustment steps applied by a duty cycle controller, and known or calculated duty cycle failure target values may enable the end-of-life (failure) date of an IC to be predicted. A user or system administrator, for example, of a computer or electronic system may then be notified of the predicted failure of the clock distribution circuit of the IC, and the IC, enabling corrective action to be undertaken before a failure occurs. Corrective actions may include restoring the clock duty cycle of the IC to a specified operating range by replacing chips, printed circuit boards, or other functional units containing chips.

Figure 2:
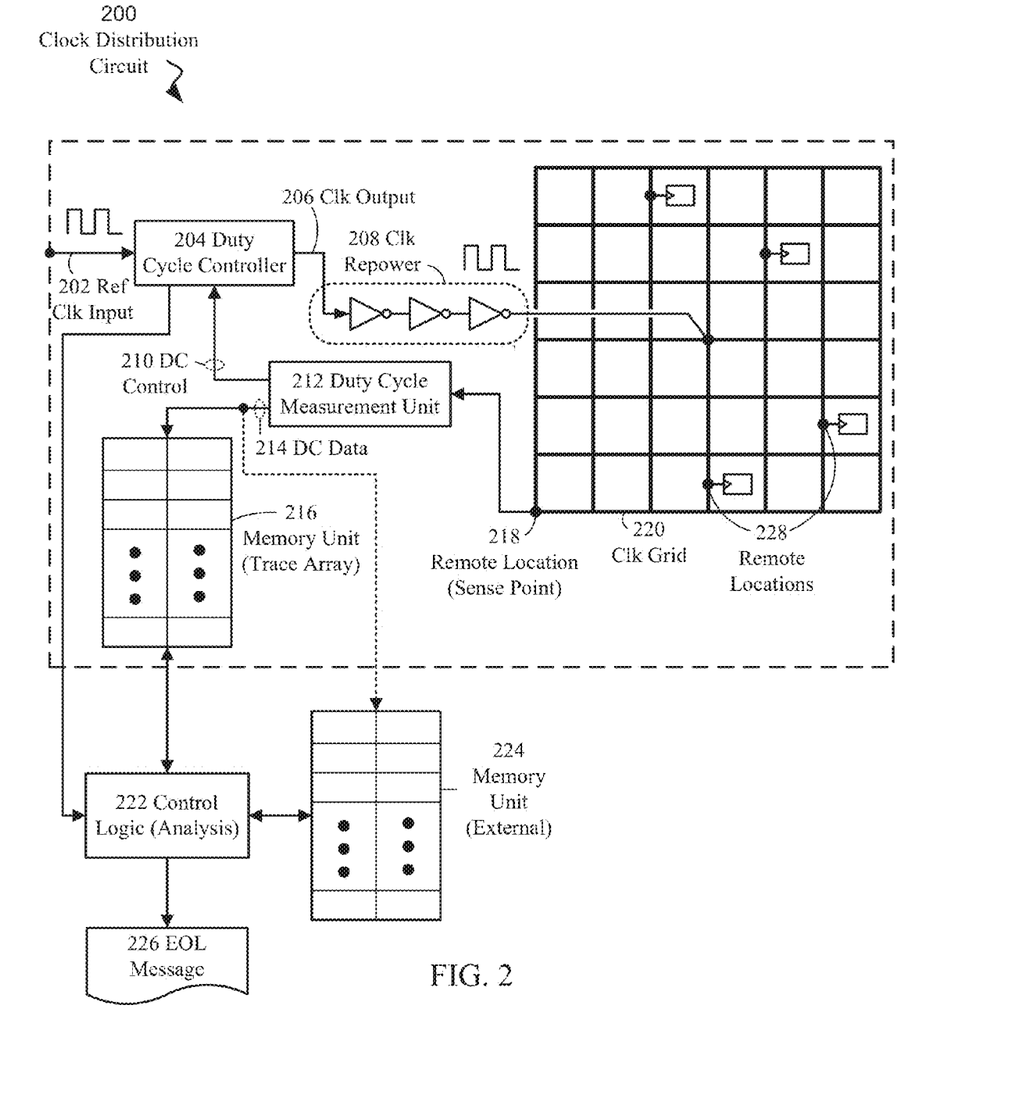
FIG. 2 is a block diagram representation of a clock distribution circuit, including a duty cycle controller, duty cycle measurement unit, and storage arrays, according to embodiments.

Certain embodiments relate to a system for monitoring the drift of an IC clock duty cycle, and subsequently calculating and transmitting EOL date. FIG. 2 is a block diagram representation of a system including a closed-loop clock distribution circuit 200, having a duty cycle controller 204, duty cycle measurement unit 212, control logic 222 and memory units 216, 224, according to embodiments. Clock distribution circuit 200 may be useful for monitoring and making adjustments to a duty cycle of an integrated circuit (IC) clock signal, to maintain it within a specified range of values. Clock distribution circuit 200 may also be useful for recording duty cycle measurement data, applying the data to a model, and generating and transmitting a predicted EOL date for the IC, based on the output of the model, according to embodiments.

According to embodiments, clock distribution circuit 200 may make use of interaction between duty cycle measurement unit 212 and duty cycle controller 204 to monitor a duty cycle of an integrated circuit (IC) clock signal, and make adjustments to the duty cycle, to maintain it within a specified range of values. Maintaining the duty cycle in a specified range of operation may allow the IC to function reliably. Duty cycle controller 204 may be designed to receive a reference clock input 202 from a source either internal or external to the IC, and output, in response to the reference clock input 202, a clock output signal on a clock output 206. Duty cycle controller 204 may change the duty cycle of clock output signal, in response to a duty cycle control signal 210, using a number of adjustment steps, to maintain the duty cycle of the clock output signal within a specified duty cycle range. Duty cycle controller 204 may have the specified duty cycle range designed into it, and may have an adjustment state that indicates a number of steps used in adjusting the duty cycle of the clock output signal. The duty cycle control signal 210 may be based on at least one duty cycle data value, resulting from at least one duty cycle measurement.

Clock output 206 may be coupled to clock repower 208, which may be coupled to, and used to transmit the clock output signal to, clock grid 220. Clock grid 220 may be configured to distribute the clock output signal to a plurality of remote locations 228, which may include synchronous data storage elements (e.g., latches or flip-flops) in various locations on the IC, and may also include a remote sense point 218. Clock repower 208 may include a plurality of buffers and/or inverter stages designed to have a final output coupled to, and with sufficient drive strength to drive, clock grid 220.

Duty cycle measurement unit 212 may be coupled to sense point 218, and may receive, and measure the duty cycle of, the clock signal from remote sense point 218, at a plurality of time intervals. Duty cycle measurement unit 212 may also generate the duty cycle control signal 210, based on at least one of the duty cycle measurements. The duty cycle control signal 210 may include a number of bits that represent a number corresponding to the duty cycle, for example, a percentage, such as 50%.

Duty cycle controller 204, clock output 206, clock repower 208, clock grid 220, remote sense location 218, duty cycle measurement unit 212, and duty cycle control signal 210 comprise a closed-loop feedback system that may be useful for maintaining the duty cycle of a clock distributed on an IC, within a specified operational range.

Clock distribution circuit 200 may make use of interaction between duty cycle measurement unit 212, memory units 216, 224 and control logic 222, to measure and record the duty cycle of an integrated circuit (IC) clock signal, to apply a model to generate an EOL date, and to transmit the EOL date, according to certain embodiments.

Duty cycle measurement unit 212 may generate duty cycle data values, corresponding to duty cycle measurements, for the clock output signal (from remote sense point 218), at a plurality of time intervals. Duty cycle data values may be, for example, a number corresponding to a percentage of the IC's clock cycle (e.g., 50%), and may be represented and stored as binary numbers. The time interval between sequential clock duty cycle measurements (and generation of corresponding duty cycle data values) may be very long compared to the clock period, as a result of an anticipated rate of duty cycle drift due to electromigration and NBTI effects. For example, in an embodiment, the measurement time interval may be a week, and in one embodiment, the measurement time interval may be a month.

Duty cycle measurement unit 212 may be designed to write the duty cycle data values 214 to a memory unit designed with a plurality of data storage locations to store duty cycle data values. The memory unit 216, 224 may be organized internally as an array of data values, for example. In an embodiment, the memory unit 216 may be located on the same IC as the clock distribution circuit, and may be, for example a trace array designed into the IC. In one embodiment the memory unit 224 may be located external to the IC, for example, as part of a host computer system. In such an embodiment, the memory unit 224 may be located in a semiconductor memory device, such as dynamic random-access memory (DRAM), or a flash memory device, or may be stored as data on a hard disk drive, for example. If the memory unit includes volatile memory devices, a non-volatile power supply, such as a battery backup, may be used to ensure reliable long-term storage of the duty cycle data.

Control logic 222 may be designed to access the duty cycle data (stored in memory unit(s) 216, 224), and to access an adjustment state (number of adjustments steps in use) of the duty cycle controller 204. Control logic 222 may apply the duty cycle data and adjustment state information to a model, which may generate a predicted EOL date for the clock distribution circuit and the IC.

In an embodiment, control logic 222 may be located on the same IC as the clock distribution circuit, and may be, for example, a section of logic, or processor core on the IC. In one embodiment the control logic 222 may be located external to the IC, for example, as part of a host computer system. In such an embodiment, the control logic 222 may comprise a program run on a processor within the host computer system, for example.

Control logic 222 may be designed to transmit the predicted EOL date, in response to a failure prediction request, from a requesting client. In embodiments, the requesting client may be a timer circuit or program designed to initiate a request at a predetermined regular interval, for example, every 30 days. In certain embodiments, the requesting client may also be a computer user, system administrator, or other source. EOL message 226 may be sent through an email, console message, text message, or written to a file, consistent with current electronic messaging technologies. EOL message 226 may be sent to a user, system administrator, or service technician or department, for example, according to embodiments.

Figure 3:
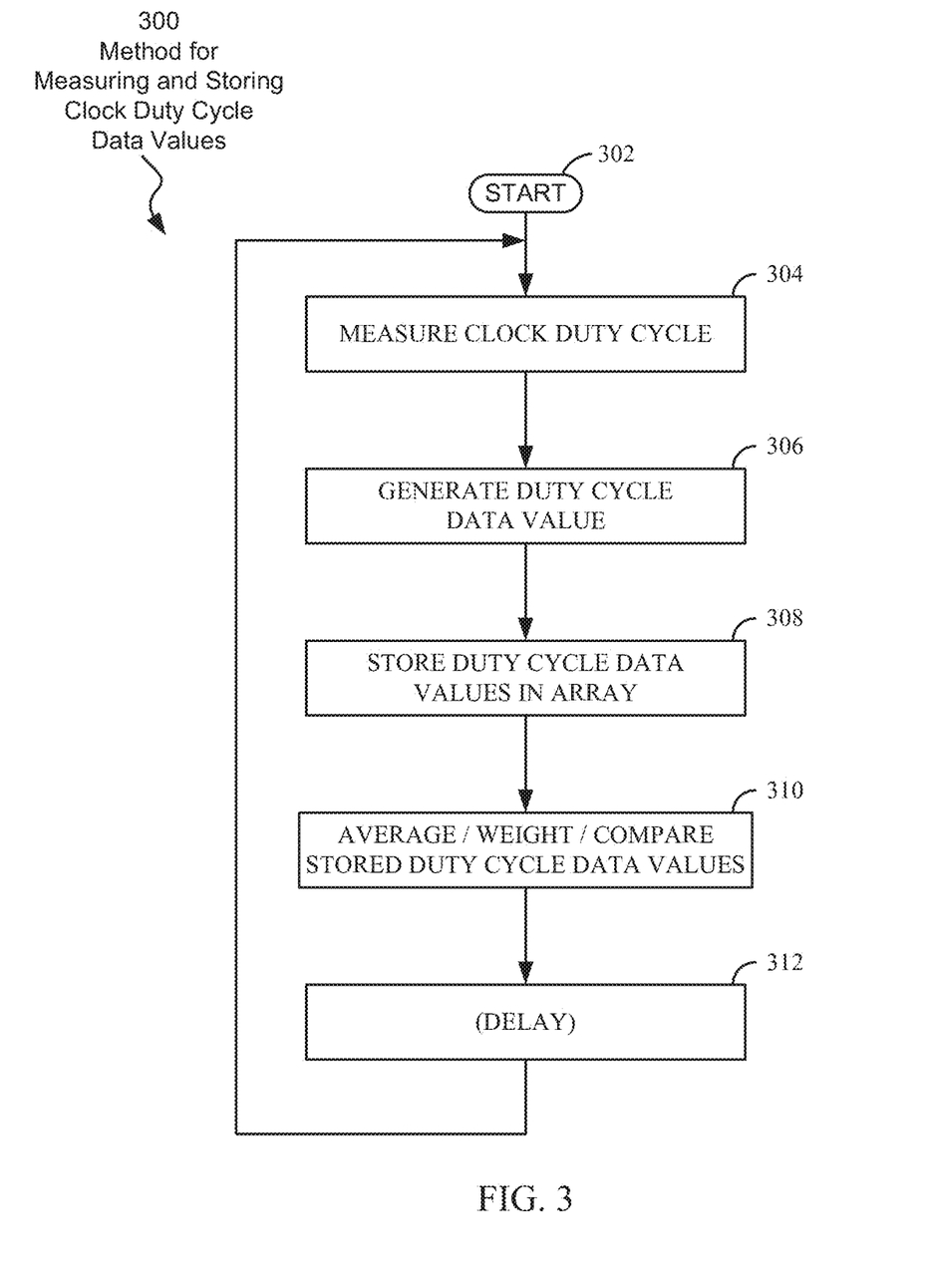
FIG. 3 is a flow diagram illustrating a method for measuring clock duty cycle data values, according to embodiments.

FIG. 3 is a flow diagram illustrating a method 300 for measuring (monitoring) and storing (recording) duty cycle data values an IC clock, according to embodiments. The method 300 may involve control logic, a duty cycle measurement unit, and memory units (222, 212, 216, 224, respectively, FIG. 2). The method 300 may be useful for providing a set of historical duty cycle data measurements that may be used as input to a model for generating an end-of-life date. The process 300 moves from start 302 to operation 304. Operation 304 generally refers to measuring the duty cycle of the clock signal. A duty cycle measurement unit (212, FIG. 2), may be used to measure, a predetermined time interval, the duration of a clock output signal at a first level and a duration of the clock output signal at a second level. For example the duty cycle measurement unit (212, FIG. 2) may measure the duration ($T_{HIGH}$, FIG. 1) of the clock signal at remote sense point 218, at a logical high level, and the duration ($T_{LOW}$, FIG. 1) of the clock signal at a logical low level, once every 15 days, in certain embodiments. The durations of the clock at the high and low levels may be used to calculate the clock's duty cycle. Once the duty cycle of the clock signal has been measured, the process moves to operation 306.

Operation 306 generally refers to generating a duty cycle data value. Duty cycle measurement of operation 304 may be formatted or converted into a numerical form suitable for storage in a memory unit, such as a collection of bits that represent number corresponding to percentage of time the clock signal is at a high state, relative to its period. The duty cycle data value may be generated once per predetermined time (measurement) interval. Once a duty cycle data value has been generated, the process moves to operation 308.

Operation 308 generally refers to storing duty cycle data values in an array. The duty cycle data values generated in operation 306 may be written by the duty cycle measurement unit 212 into an array within a memory unit. The memory unit may be designed having a plurality of data storage locations in which to store duty cycle data values, and the data storage locations may be arranged in an array structure. The memory unit may be on the same IC as the clock distribution circuit, or may be external to the IC. The array may be configured, for example, as a 2-dimensional structure having rows and columns. Storing duty cycle data values in an array may be useful in making them available for access and analysis. Once duty cycle data values have been stored in an array, the process moves to operation 310.

Operation 310 generally refers to averaging, weighting, and/or comparing duty cycle data measurement values stored in the array. A model used to predict an end-of-life (EOL) date may use duty cycle data values that have been averaged, had a weighting coefficient applied to them, or have been compared to each other, as input. In certain embodiments, for example, a model may use, as input, one or more averages of several duty cycle data values. In an embodiment, applying the model to duty cycle data may include applying a set of time-based weighting factors to the duty cycle data values. For example, the set of time-based weighting factors may create a linear, exponential, or logarithmic weighting relationship among the duty cycle data values over time. Weighting stored duty cycle data values in accordance with the times they were sampled may be useful in assigning more recent samples a greater significance in the model than samples that were taken earlier in time. The control logic (e.g., 222, FIG. 2) may be used to perform averaging, weighting and comparison operations, and may store the resulting data in the memory unit (e.g., 216, 224, FIG. 2). Once duty cycle data values stored in the array have been averaged, weighted, and or compared, the process moves to operation 312.

Operation 312 generally refers to a time delay function. A time delay may be implemented in order to limit the frequency of measuring the clock duty cycle, in accordance with the expected (slow) drift rate of duty cycle over time. In one embodiment, for example, the duty cycle may be measured every 30 days. In certain embodiments the time delay may be implemented as logic or circuitry within the IC, and in certain embodiments time delay may result from software instructions run on a host computer. Once the time delay function has been executed, the process returns to operation 304, and resumes with another duty cycle data measurement.

Figure 4:
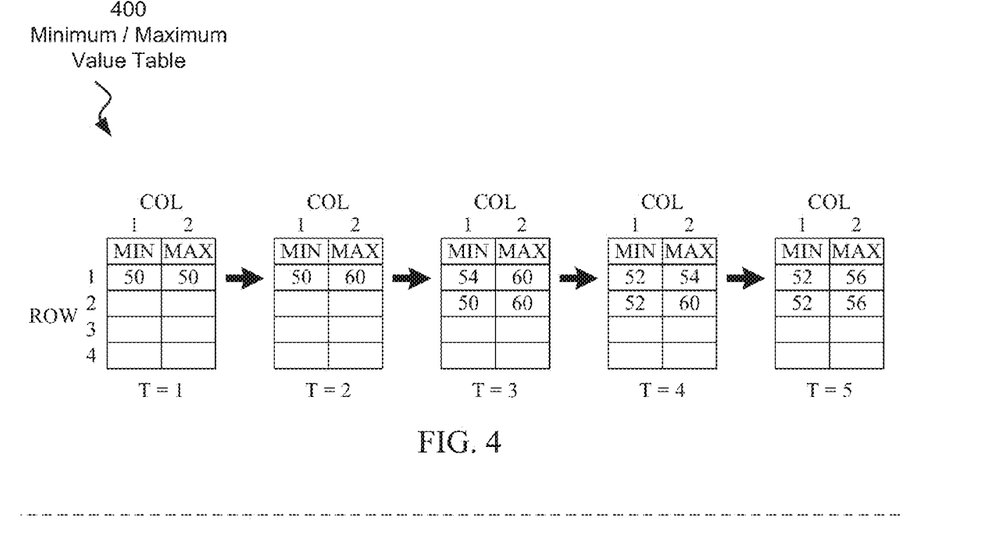
FIG. 4 is a representation of a data storage array, illustrating stored minimum and maximum duty cycle data values, according to embodiments.

FIG. 4 is a representation of a data storage array, illustrating a method of storing minimum and maximum duty cycle data values, according to embodiments. The data storage array may be contained in a memory unit (e.g., 216, 224, FIG. 2). Minimum and maximum values stored in the array may be useful as input to an EOL prediction model.

FIG. 4 illustrates a table having 2 columns and 4 rows, at times T=1 . . . T=5, following the generation of 5 sequential duty cycle data values (306, FIG. 3). The sequence of steps illustrated in FIG. 4 may correspond to a comparison of stored duty cycle data values (310, FIG. 3). The comparison, reading, and writing of duty cycle data values may be executed by duty cycle measurement unit 212, or control logic 222.

The 5 duty cycle data values generated in this example are, in sequence, 50, 60, 54, 52 and 56. The position of table entries described in this example may be referred to in a row and column fashion: (row, column). For example, an array position or entry in the second row and first column may be referred to as position (2, 1). Column 1 may be used to store minimum values and column 2 may be used to store maximum values.

Starting at time T=1, a duty cycle data value 50 is received, and written in positions (1,1) and (1,2) as it is the current minimum and maximum value.

At time T=2, a duty cycle data value 60 is received, compared to the last value received, 50, and written in position (1, 2) as the new maximum value. The last value, 50, remains in position (1, 1) as the minimum of the last two values received (50, 60).

At time T=3, another duty cycle data value, 54, is received, compared to the last value received, 60, and entered in (1, 1) as the new minimum value. The last value received, 60, remains in position (1, 2) as the maximum of the last two values received (54, 60). The value 50 is written into position (2,1) as the minimum of the last three values received, and the value 60 is written into position (2,2) as the maximum of the last three values received.

At time T=4, a new duty cycle data value 52 is received, compared to the last value received, 54, and entered in (1, 1) as the new minimum value. The value 54 is written into position (1, 2) as the maximum of the last two values received (52, 54). The value 52 is written into position (2,1) as the minimum of the last three values received, and the value 60 remains in position (2,2) as the maximum of the last three values received.

At time T=5, a duty cycle data value 56 is received, compared to the last value received, 52, and entered in (1, 2) as the new maximum value. The value 52 remains in position (1, 1) as the minimum of the last two values received (52, 56). The value 52 remains in position (2,1) as the minimum of the last three values received, and value 56 is written into position (2,2) as the maximum of the last three values received.

FIG. 4 illustrates a method of determining minimum and maximum values for 5 duty cycle data values, however, in embodiments, the comparison and data recording process may be a continuous, repeating process, and may use a different number of duty cycle values.

The steps illustrated may generate, in row 1 of the table, entries representing minimum and maximum values of a moving two-value "window" of duty cycle data values, and may generate in row 2 of the table, entries representing minimum and maximum values of a moving three-value "window" of duty cycle data values. Embodiments may include additional row entries suitable for storing minimum and maximum values for a larger number of duty cycle data samples. An array may be designed with a number of rows suitable to store a specified number of minimum and maximum duty cycle data entries. The array (e.g., a trace array) may be located on the same IC as the clock distribution circuit (200, FIG. 2), or it may be contained within a host computer as a memory device, or on a hard disk drive, for example.

A particular method of storing minimum and maximum duty cycle data values in an array, within a memory unit, is illustrated, but is not limiting. Embodiments may have different numbers of rows and/or columns, or different operations involved in the comparison and storage of the duty cycle data values.

Figure 5:
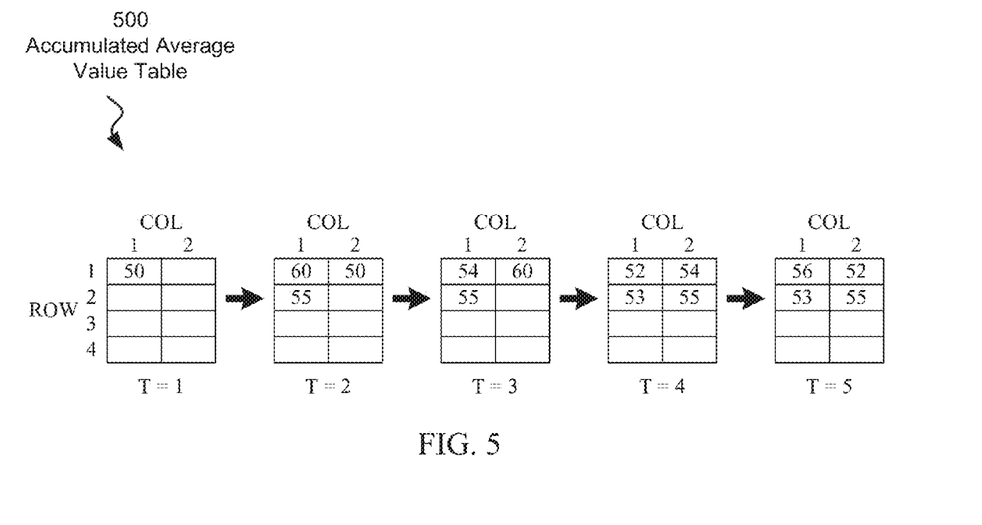
FIG. 5 is a representation of a data storage array, illustrating stored average duty cycle data values, according to embodiments.

FIG. 5 is a representation of a data storage array, illustrating a method of generating and storing averages of duty cycle data values, according to embodiments. The data storage array may be contained in a memory unit (e.g., 216, 224, FIG. 2). Average values stored in the array may be useful as input to an EOL prediction model.

FIG. 5 illustrates a table having 2 columns and 4 rows, at times T=1 . . . T=5, following the generation of 5 sequential duty cycle data values (306, FIG. 3). The sequence of steps illustrated may correspond to an averaging of stored duty cycle data values (310, FIG. 3). The averaging, reading, and writing of duty cycle data values may be executed by duty cycle measurement unit 212, or control logic 222.

The 5 duty cycle data values generated in this example are, in sequence, 50, 60, 54, 52 and 56. The position of table entries described in this example may be referred to in a (row, column) fashion. For example, an array position or entry in the second row and first column may be referred to as position (2, 1). Row 1 may be used to store received duty cycle data values, and row 2 may be used to contain averaged values.

Starting at time T=1, the duty cycle data value 50 is received, and written in position (1, 1). At time T=2, the duty cycle data value 60 is received, and the value 50 is shifted to position (1, 2), and the value 60 is written in position (1, 1). The values 50 and 60 are then averaged, and the average value is written into position (2, 1). At time T=3, the duty cycle data value 54 is received, and the value 60 is shifted to position (1, 2), and the value 54 is written in position (1, 1).

At time T=4, the duty cycle data value 52 is received, and the value 54 is shifted to position (1, 2), and the value 52 is written in position (1, 1). The values 52 and 54 are then averaged, and the average value 53 is written into position (2, 1), and the value 55 is shifted from position (2, 1) to position (2, 2). At time T=5, the duty cycle data value 56 is received, and the value 52 is shifted to position (1, 2), and the value 56 is written in position (1, 1).

FIG. 5 illustrates a method of determining average values for 2 unique pairs of received duty cycle data values, however, in embodiments, it may be expected that the averaging and data recording process may be a continuous, repeating process.

The steps illustrated may store, in row 1 of the table, entries representing the 2 most recently received duty cycle data values, and may generate, in row 2 of the table, entries representing average values of unique pairs of duty cycle data values. Embodiments may include additional row entries suitable for storing average values for a larger number of duty cycle data samples. An array may be designed with a number of rows suitable to store a specified number of average duty cycle data entries. The array (e.g., a trace array) may be located on the same IC as the clock distribution circuit (200, FIG. 2), or it may be contained within a host computer as a memory device, or on a hard disk drive, for example.

A particular method of storing average duty cycle data values in an array, within a memory unit, is illustrated, but is not limiting. Embodiments may have different numbers of rows and/or columns, or different operations involved in the computation and storage of the duty cycle data values.

Figure 6:
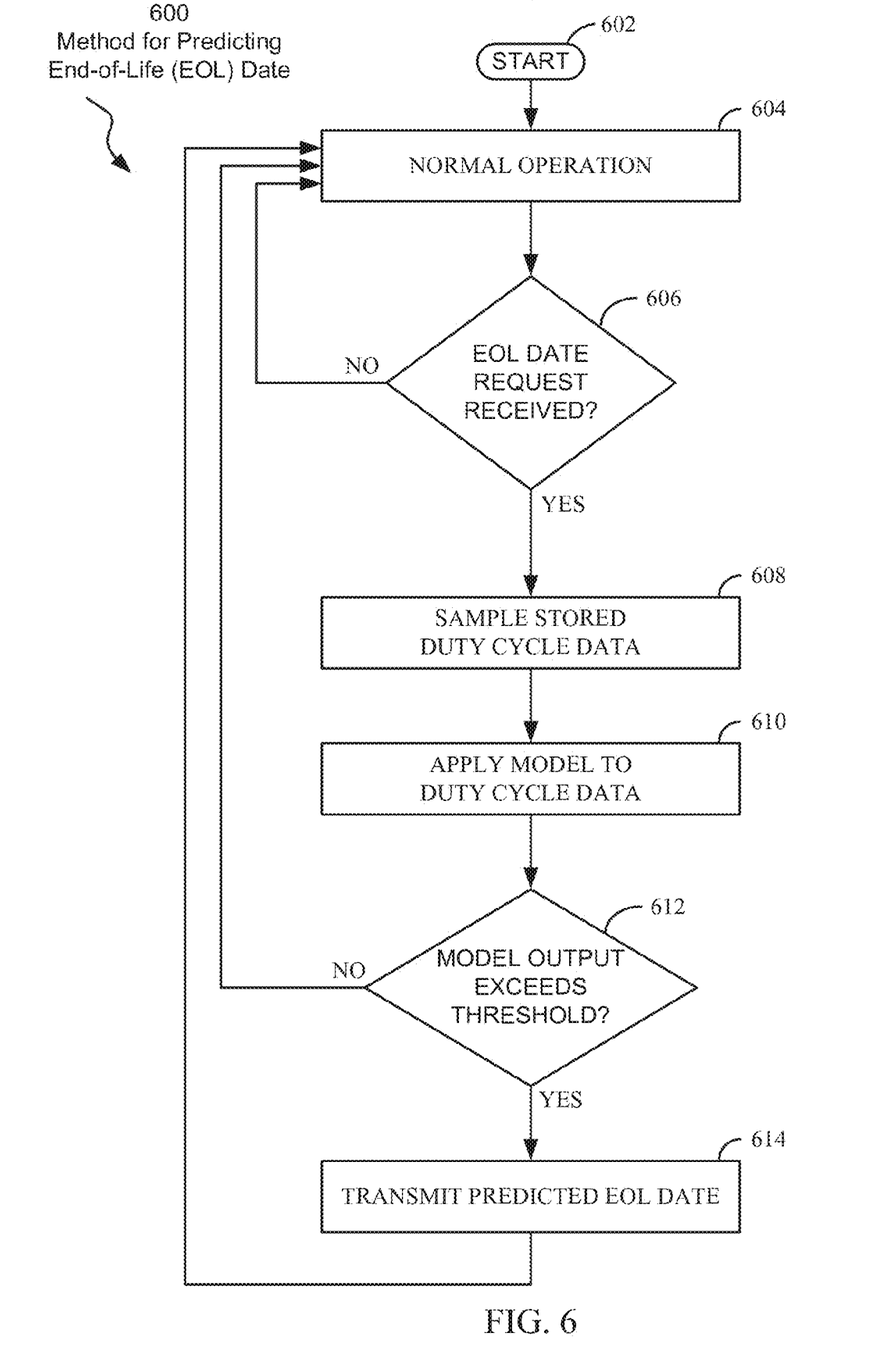
FIG. 6 is a flow diagram illustrating a method for predicting a failure date of an integrated circuit (IC), according to embodiments.

FIG. 6 is a flow diagram illustrating a method 600 for predicting an EOL date of a clock distribution structure of an IC, according to embodiments. The method 600 may be executed by control logic (e.g., 222, FIG. 2). The process 600 moves from start 602 to operation 604. Operation 604 generally refers to a "normal operation", which may include filling data tables with, and/or performing operations on, duty cycle data values, as described and illustrated in FIG. 3 (310), FIG. 4, 5. Operations may include averaging, determining minimum/maximum values, and applying weighting factors. The "normal operation" may last for an extended period of time between failure prediction requests. Once the normal operation is complete, the process moves to decision 606.

At decision 606, the control logic 222 (FIG. 2) may determine if an EOL date request has been received from a requesting client. A requesting client may be a timer circuit or program designed to initiate a request at a predetermined regular interval, a computer user, system administrator, or other manual or automated source. If a request is received, then the process moves to operation 608. If a request is not received, then the process 600 may return to operation 604.

Operation 608 generally refers to sampling stored duty cycle data. The control logic 222 (FIG. 2) may be used to read duty cycle data stored in a memory unit, e.g., 216, 224 (FIG. 2), and may also read the adjustment state of the duty cycle controller (e.g., 204, FIG. 2). An adjustment state of the duty cycle controller may be the number of remaining (unused) duty cycle adjustment steps in the controller. For example, the duty cycle controller may be designed with 64 adjustments steps, each of which, when enabled, may alter the duty cycle of the clock output by a small fraction of the clock period. The adjustment state of the duty cycle controller may indicate that there are 3 unused adjustments steps at a particular time. Once the duty cycle controller enables these 3 adjustments steps, no further duty cycle adjustment may be available. Once the stored duty cycle data has been sampled, the process moves to operation 610.

Operation 610 generally refers to applying a model to duty cycle data. The control logic 222 (FIG. 2) may be used to apply a model to at least one of the duty cycle data values stored in the memory unit, e.g., 216, 224 (FIG. 2), and to the adjustment state of the duty cycle controller 204 (FIG. 2), sampled in step 608, to generate an output.

A model may include mathematical calculations, comparisons and logical decisions. A model may use regression analysis, or curve fitting, for example to fit historical failure data to coefficients or factors within the model, to create an accurate prediction of EOL dates based on historical data. An example equation which may be used to weight or curve-fit duty cycle data samples may be:

$$X = (S_1 \times C_1) + (S_2 \times C_2) + (S_3 \times C_3) + \ldots + (S_N \times C_N)$$

Where:

X is a sum of weighted duty cycle samples, used in the model $S_1 \ldots S_N$ are duty cycle samples ($S_1$ is most recent, and $S_N$ is the oldest)

$C_1 \ldots C_N$ are duty cycle sample coefficients

The numerical relationship between coefficients $C_1 \ldots C_N$ may be specified to be linear, logarithmic, exponential, or may have some other mathematical or empirical relationship suitable for fitting the model to actual, historical failure data. In certain embodiments, other equations may be used within the model, and may have a different number of terms, relationships between the terms, different coefficients, as may occur to one skilled in the art.

A model may include the steps described in reference to operation 310 (FIG. 3), and FIGS. 4 and 5. Outputs of a model may include the number of (unused) remaining adjustment steps of the duty cycle controller, a projected time remaining until clock distribution circuit failure, or a percent of duty cycle between a present value and a failure value. For example, model output may include data indicating 3 remaining adjustment steps, 2.5 months until an expected failure, or 2% of the duty cycle left between a present value and a failure value. The output of the model, regardless of type, may be used to predict and EOL date. Once the model is applied to duty cycle data, the process moves to decision 612.

At decision 612, the control logic 222 may determine, by comparison, if the output of the model exceeds at least one predetermined failure threshold (value). For example, a particular failure threshold may be 4 duty cycle controller adjustments steps. Another type of failure threshold may be 5% of the duty cycle remaining (between a present value and a failure value). Failure thresholds may be based on historical IC failure data, or calculated values, and may, in certain embodiments, be coded into a control logic 222 (FIG. 2), and in some embodiments stored in a memory unit such as 216, 224 (FIG. 2). If a failure threshold has been exceeded, then the process moves to operation 614. If a failure threshold has not been exceeded, then the process returns to operation 604.

Operation 614 generally refers to transmitting the predicted EOL date to the requesting client, as described in reference to step 606. Control logic 222 may be used to transmit the predicted EOL date, in response to a failure prediction request, from a requesting client. EOL message 226 (FIG. 2), containing an EOL date, may be transmitted through an email, console message, text message, or written to a file, consistent with current electronic messaging technologies. The recipient of the message may be a user, system administrator, or hardware manufacturer, or service representative, for example. Once the predicted EOL date is transmitted, then the process 600 may return to operation 604. In the case where a corrective action, such as replacing an IC, is not taken before the next EOL date request is received, process 600 may execute (multiple times) from operation 604 through operation 614, and may transmit a plurality of its predicted EOL dates.

Figure 7:
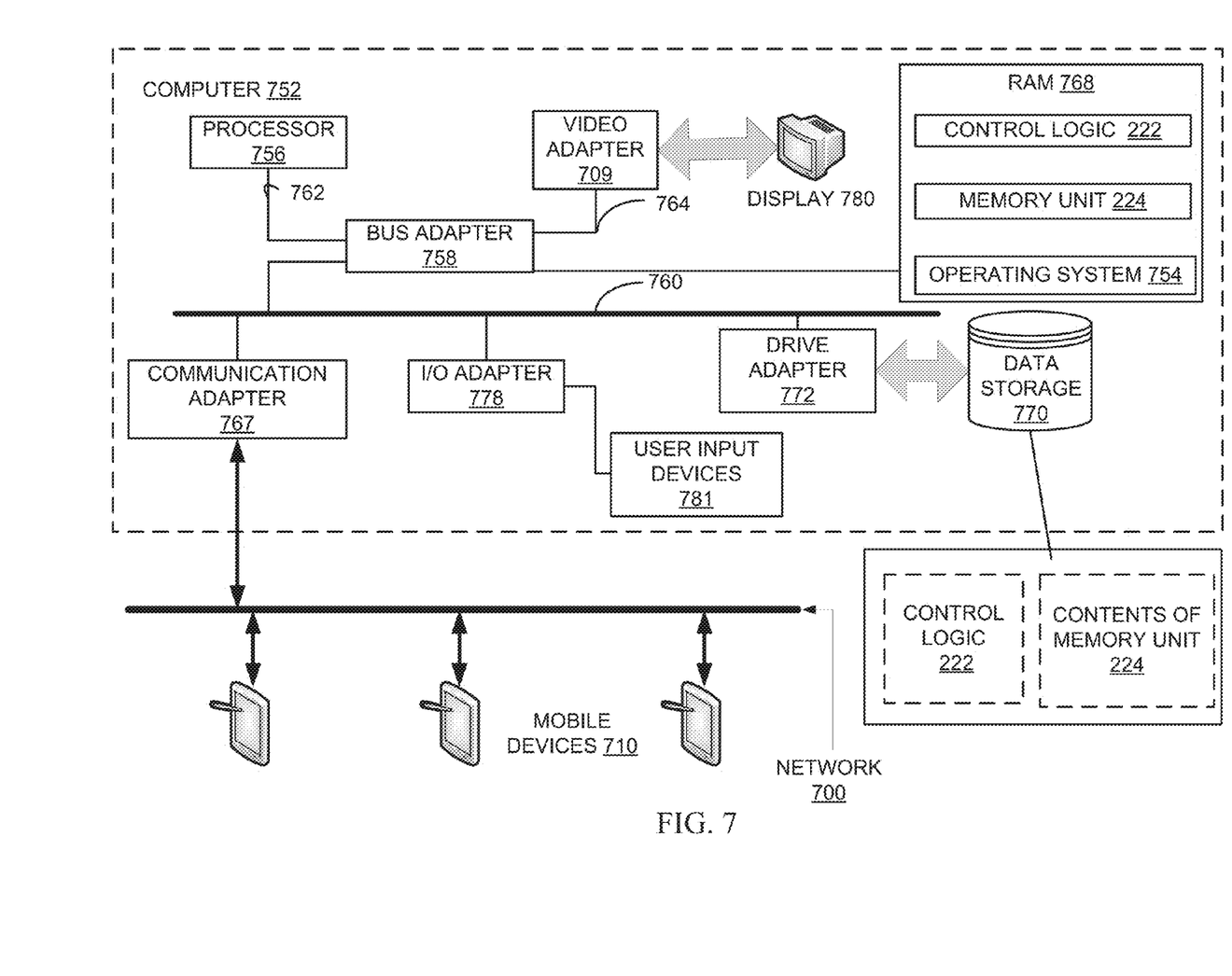
FIG. 7 depicts a block diagram of automated computing machinery, according to an embodiment.

FIG. 7 depicts a block diagram of automated computing machinery, according to an embodiment. The computing machinery can include example computer 752 useful in performing duty cycle data monitoring, and EOL prediction operations, according to various embodiments. The computer 752 of FIG. 7 includes at least one computer processor 756 or 'CPU' as well as random access memory 768 ('RAM') which is connected through bus adapter 758 to processor 756 and to other components of the computer 752.

The RAM 768 can be configured to store control logic 222. The control logic 222 can be a set of instructions that are executed by processor 756, and may also include one or more associated components as separate programs of included within the control logic 222, according to embodiments of the present disclosure. The RAM 768 can include a memory unit 224, a portion of a memory device designed for storing duty cycle data values, including averaged, weighted, and calculated values, according to embodiments of the present disclosure. Also stored in RAM 768 is an operating system 754. Operating systems useful for supporting logic for monitoring clock duty cycle data, and predicting EOL failure dates, according to embodiments of the present disclosure include UNIX®, Linux®, Microsoft XP™, AIX®, IBM's i5/OS™, and others. The operating system 754, control logic 222, and memory unit 224 are shown in RAM (768), but many components of such software typically are stored in non-volatile memory also, such as, for example, on a disk drive 770.

The computer 752 can also include disk drive adapter 772 coupled through expansion bus 760 and bus adapter 758 to processor 756 and other components of the computer 752. Disk drive adapter 772 connects non-volatile data storage to the computer 752 in the form of disk drive 770. Disk drive adapters useful in computers for storing duty cycle data values according to embodiments of the present disclosure include Integrated Drive Electronics ('IDE') adapters, Small Computer System Interface ('SCSI') adapters, and others. Non-volatile computer memory also may be implemented for as an optical disk drive, electrically erasable programmable read-only memory (so-called 'EEPROM' or 'Flash' memory), RAM drives, and so on.

The disk drive 770 can be a RAID-configured storage device that includes one or more disk drives. The disk drive 770 can store the control logic 222 and the memory unit 224 used by the control logic 222.

The example computer 752 includes one or more input/output (I/O') adapters 778. I/O adapters implement user-oriented input/output through, for example, software drivers and computer hardware for controlling output to display devices such as computer display screens, as well as user input from user input devices 781 such as keyboards and mice. The example computer 752 includes a video adapter 709, which is an example of an I/O adapter specially designed for graphic output to a display device 780 such as a display screen or computer monitor. Video adapter 709 is connected to processor 756 through a high speed video bus 764, bus adapter 758, and the front side bus 762, which is also a high speed bus.

The example computer 752 includes a communications adapter 767 for data communications with other computers 710, e.g., mobile devices, and for data communications with a data communications network 700. Such data communications may be carried out serially through RS-232 connections, through external buses such as a Universal Serial Bus ('USB'), through data communications networks such as IP data communications networks, and in other ways as will occur to those of skill in the art. Communications adapters implement the hardware level of data communications through which one computer sends data communications to another computer, directly or through a data communications network. Examples of communications adapters useful for duty cycle data monitoring, according to embodiments of the present disclosure include modems for wired dial-up communications, Ethernet (IEEE 802.3) adapters for wired data communications network communications, and IEEE 802.77 adapters for wireless data communications network communications.

A mobile device 710 can have local programs that are separate from the control logic 222. The local programs can work in conjunction with the control logic 222.

Embodiments of the disclosure can take the form of an entirely hardware embodiment, an entirely software embodiment, or an embodiment containing both hardware and software elements. In one embodiment, the disclosure is implemented in software, which includes but is not limited to firmware, resident software, microcode, etc.

Furthermore, embodiments of the disclosure can take the form of a computer program product accessible from a computer-usable or computer-readable storage medium providing program code for use by or in connection with a computer or any instruction execution system. For the purposes of this description, a computer usable or computer readable storage medium can be any apparatus that can store the program for use by or in connection with the instruction execution system, apparatus, or device.

The computer-useable or computer-readable storage medium can be an electronic, magnetic, optical, electromagnetic, or semiconductor system (or apparatus or device), or a propagation medium. Examples of a computer-readable storage medium include a semiconductor or solid state memory, magnetic tape, a removable computer diskette, a random access memory (RAM), a read-only memory (ROM), a rigid magnetic disk, and an optical disk. Current examples of optical disks include a compact disk with read only memory (CD-ROM), a compact disk with read/Write (CD-R/W), and a digital video disk (DVD).

An embodiment of a data processing system suitable for storing and/or executing program code includes at least one processor coupled directly or indirectly to memory elements through a system bus such as a data, address, and/or control bus. The memory elements can include local memory employed during actual execution of the program code, bulk storage, and cache memories which may provide temporary storage of at least some program code in order to reduce the number of times code must be retrieved from bulk storage during execution.

Input/output or I/O devices (including but not limited to keyboards, displays, pointing devices, etc.) can be coupled to the system either directly or through intervening I/O controllers. Additionally, network adapters also may be coupled to the system to enable the data processing system to become coupled to other data processing systems or remote printers or storage devices through intervening private or public networks. Modems, cable modems, and Ethernet cards are just a few of the currently available types of network adapters.

Although the operations of the method(s) herein are shown and described in a particular order, the order of the operations of each method may be altered so that certain operations may be performed in an inverse order or so that certain operations may be performed, at least in part, concurrently with other operations. In another embodiment, instructions or sub-operations of distinct operations may be implemented in an intermittent and/or alternating manner.

Although specific embodiments of the disclosure have been described and illustrated, the disclosure is not to be limited to the specific forms or arrangements of parts so described and illustrated. The scope of the disclosure is to be defined by the claims appended hereto and their equivalents.

Although the present disclosure has been described in terms of specific embodiments, it is anticipated that alterations and modifications thereof may become apparent to those skilled in the art. Therefore, it is intended that the following claims be interpreted as covering all such alterations and modifications as fall within the true spirit and scope of the disclosure.

What is claimed is:

1. A system comprising:
a clock distribution circuit having:
    a duty cycle controller, designed to:
        receive a reference clock input;
        output, in response to the reference clock input, a clock output signal on a clock output; and
        adjust, in response to a duty cycle control signal, a duty cycle of the clock output signal;
    a clock grid, coupled to the clock output and designed to distribute the clock output signal to a plurality of remote locations;
    a duty cycle measurement unit, designed to:
        measure the duty cycle of the clock output signal at one of the remote locations and at a plurality of time intervals;
        generate duty cycle data values for the clock output signal at the plurality of time intervals;
        generate the duty cycle control signal based on at least one of the duty cycle data values; and
        write the duty cycle data values to a memory unit designed to store a plurality of duty cycle data values; and
    control logic designed to:
        calculate a predicted end-of-life (EOL) date for the clock distribution circuit by applying a model to:
            duty cycle data values from the memory unit; and
            an adjustment state of the duty cycle controller;
        transmit the predicted EOL date, in response to a failure prediction request.

2. The system of claim 1, further comprising the memory unit and wherein the memory unit has a plurality of data storage locations designed to store duty cycle data values.

3. The system of claim 2, wherein the clock distribution circuit is a part of an IC, and the memory unit is part of the IC.

4. The system of claim 2, wherein the clock distribution circuit is a part of an IC, and the memory unit is external to the IC.

5. The system of claim 2, wherein the clock distribution circuit is a part of an IC, and the memory unit is a trace array on the IC.

6. The system of claim 1, wherein the clock distribution circuit is a part of an IC, and the control logic is part of the IC.

7. The system of claim 1, wherein the clock distribution circuit is a part of an IC, and the control logic is external to the IC.

8. The system of claim 1, wherein the adjustment state of the duty cycle controller indicates a number of steps used in adjusting the duty cycle of the clock output signal.

9. A method for monitoring and recording duty cycle data of an integrated circuit (IC), comprising:
generating, in response to a reference clock, a clock output signal having a duty cycle;
transmitting the clock output signal to a clock grid configured to distribute the clock output signal to a plurality of remote locations;
measuring the duty cycle of the clock output signal at a one of the remote locations and at a plurality of time intervals;
generating duty cycle data values for the clock output signal at the plurality of time intervals;
modifying, based on at least one duty cycle data value, the duty cycle of the clock output signal; and writing the duty cycle data values to a memory unit, and
generating a predicted end-of-life (EOL) date of the IC by applying a model to duty cycle data values from the memory unit, and to an adjustment state of the duty cycle controller.

10. The method of claim 9, wherein applying the model further comprises averaging a plurality of duty cycle data values.

11. The method of claim 9, wherein applying the model further comprises determining, within a specified time period, a minimum and a maximum of a plurality of duty cycle data values.

12. The method of claim 9, wherein applying the generating of the predicted EOL date further comprises comparing an output of the model with at least one historical failure point.

13. The method of claim 9, wherein applying the model further comprises applying a set of time-based weighting factors to the duty cycle data values.

14. The method of claim 13, wherein the set of time-based weighting factors create a linear weighting relationship among the duty cycle data values.

15. The method of claim 13, wherein the set of time-based weighting factors create an exponential weighting relationship among the duty cycle data values.

16. The method of claim 13, wherein the set of time-based weighting factors create a logarithmic weighting relationship among the duty cycle data values.

17. A method for monitoring and recording duty cycle data of an integrated circuit (IC), comprising:

measuring, at a predetermined interval, and with a duty cycle measurement unit, a duration of a clock output signal at a first level and a duration of the clock output signal at a second level;

calculating, from the duration of the clock output signal at the first and at the second level of the clock output signal, duty cycle data values, over a time period;

storing the duty cycle data values in a storage location in a memory unit;

receiving an end-of-life (EOL) date request from a requesting client;

applying a model to at least one of the stored duty cycle data values and to an adjustment state of the duty cycle controller, to generate an output;

comparing the output of the model to at least one predetermined duty cycle failure value;

calculating, based on the output of the model, a predicted EOL date; and transmitting the predicted EOL date to the requesting client.

18. The method of claim 17, wherein applying the model includes applying time-based weighting factors to the stored duty cycle data values to create a logarithmic weighting of duty cycle values over time.

19. The method of claim 17, wherein applying the model includes applying time-based weighting factors to the stored duty cycle data values to create an exponential weighting of duty cycle values over time.

* * * * *